United States Patent [19]

Danckaert et al.

[11] Patent Number: 5,045,727

[45] Date of Patent: Sep. 3, 1991

[54] INTERFACE CIRCUIT BETWEEN TWO CIRCUITS OF DIFFERENT LOGIC TYPES

[75] Inventors: Jean-Yves Danckaert, Les Ults; Ernesto Perea, Gif Sur Yvette, both of France

[73] Assignee: Thomson Composants Microondes, Puteaux, France

[21] Appl. No.: 538,703

[22] Filed: Jun. 15, 1990

[30] Foreign Application Priority Data

Jun. 20, 1989 [FR] France ............................. 89 08182

[51] Int. Cl.⁵ ...................... H03K 19/02; H03K 17/16
[52] U.S. Cl. .................................. 307/475; 307/448; 307/450; 307/355; 307/359; 307/362
[58] Field of Search ............... 307/443, 448, 450, 475, 307/362, 355, 359, 296.4

[56] References Cited

U.S. PATENT DOCUMENTS 4,663,543  5/1987  Sitch ..................................... 307/450
4,713,559 12/1987  Vu et al. .............................. 307/475

FOREIGN PATENT DOCUMENTS 0110701  6/1984  European Pat. Off. .

OTHER PUBLICATIONS

"Fully ECL Compatible GaAs Standard Cell Library" 8107 IEEE Journal of Solid State Circuits, Jun. 23, 1988, pp. 676-680.

"$V_{BB}$ Feedback Approach for Achieving ECL Compatibility in GaAs ILs" Eden et al., IEEE GaAs IC Symposium 1986, pp. 123-127.

Primary Examiner—Stanley D. Miller
Assistant Examiner—Margaret Rose Wambach
Attorney, Agent, or Firm—Oblon, Spivak, McClelland, Maier & Neustadt

[57] ABSTRACT

This interface constitutes an adaptation of the output signals of a first circuit, made of silicon for example, to the limit values of the input signals in a second digital circuit, made of GaAs for example. It includes a first stage (A) consisting of two parallel-mounted shifters, in which the input signal (E) and a reference (Ref) are shifted. A second stage (B), of the BFL type, compares these two values and a third stage (C) regenerates and amplifies the signals. A fourth stage (D) may give a complementary value. This interface is integrated into the chip of the second digital circuit which is made of GaAs.

9 Claims, 2 Drawing Sheets

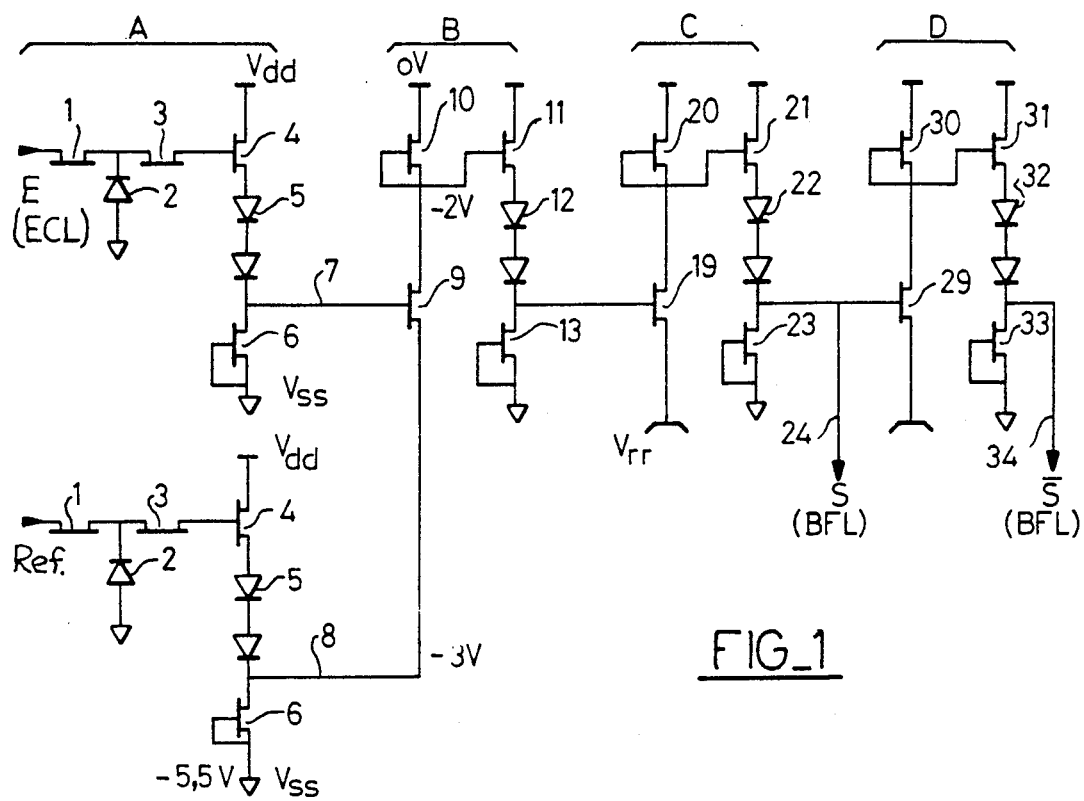
FIG_1
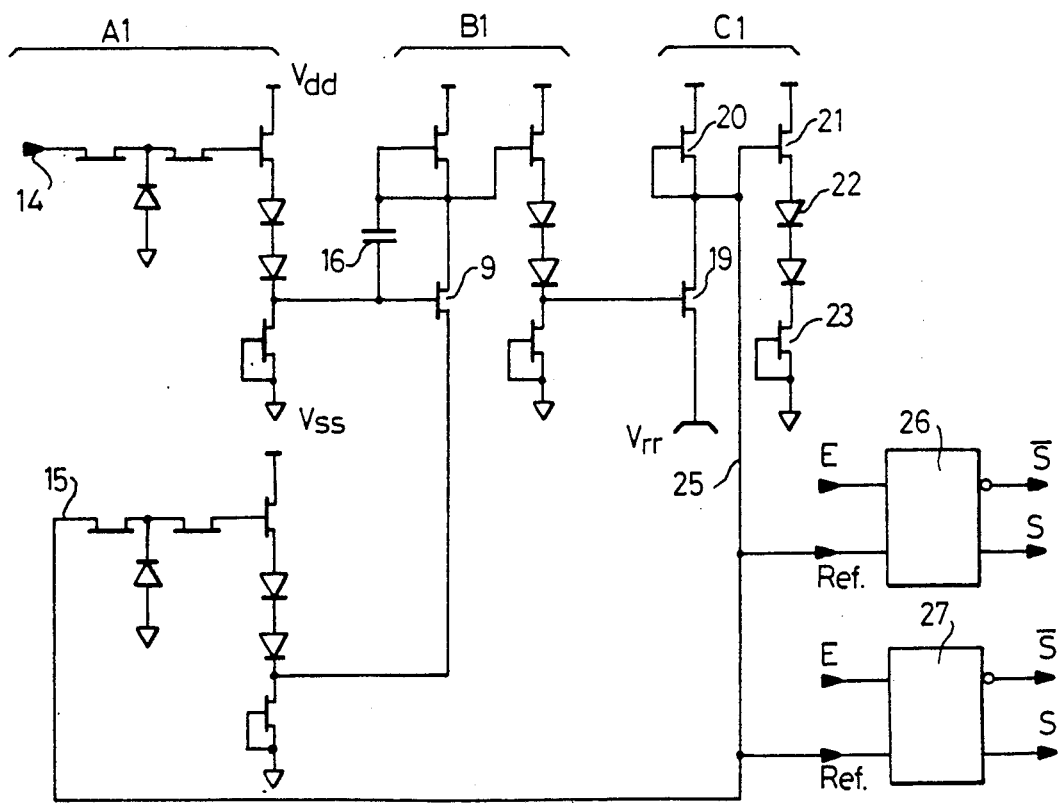
FIG_2

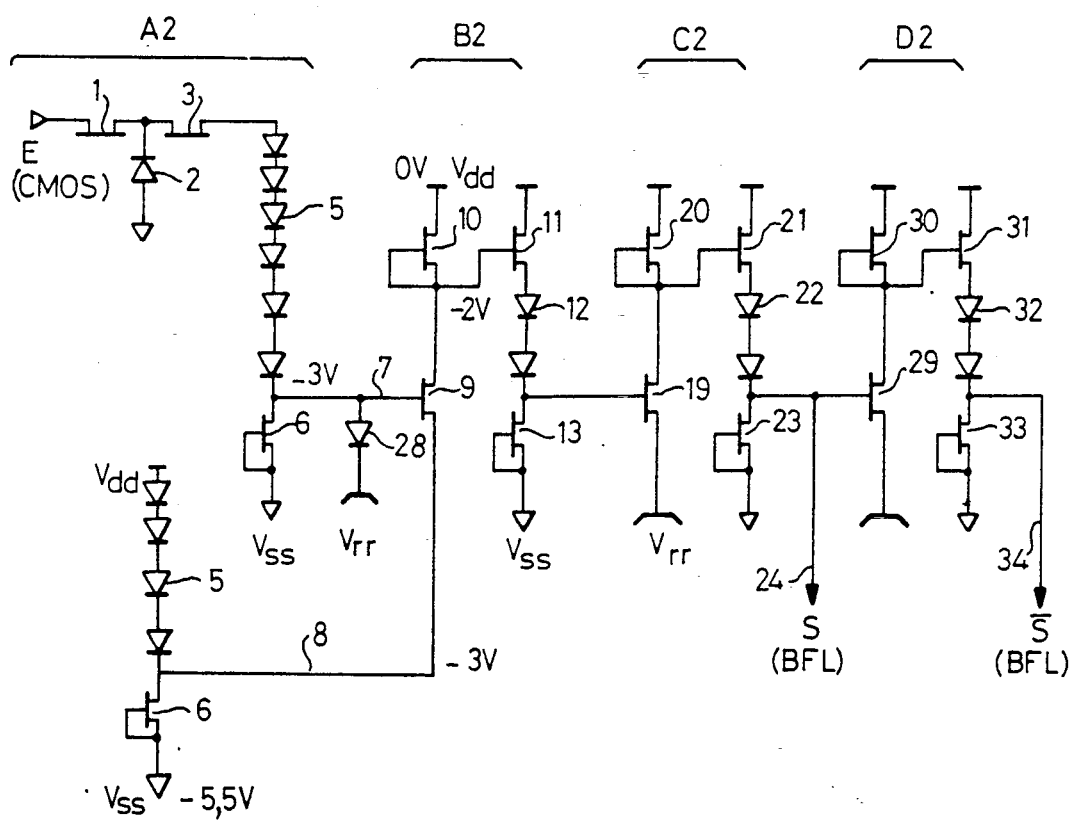
FIG_3

INTERFACE CIRCUIT BETWEEN TWO CIRCUITS OF DIFFERENT LOGIC TYPES

BACKGROUND OF THE INVENTION

1. Field of the Invention

The present invention concerns an electronic circuit that forms an input interface allowing for the compatibility of ECL or MOS type circuits, made on silicon, with BFL type circuits, for example, made on GaAs or on group III-V materials. This interface circuit is itself made of GaAs and is integrated on the chip of the BFL type circuit for which it forms an input contact.

2. Description of the Prior Art

It is known that the processing of microwave signals calls for the use of digital circuits on GaAs (or other fast materials but GaAs is the most commonly used one) and of digital circuits on silicon. Circuits on GaAs are faster and make it possible to reach frequencies that are not attained by circuits on silicon. However, in the present state of the technology, circuits on silicon are more developed and integrated than GaAs circuits. There is therefore a complementarity between these two types of circuits, but the output levels, in terms of voltages, of the silicon circuits are not directly adapted to the input levels of the GaAs circuits. This is why an interface is necessary.

To illustrate the invention, let us assume that the GaAs circuit has, at input, a BFL (Buffered FET Logic) gate which is well known, supplied for example between $V_{dd}=0$ V, $V_{ss}=-5.5$ V and with an intermediate voltage $V_{rr}=-3$ V. For a gate such as this, the logic levels at inputs and outputs are in the following range: $V_{high}=-2.5$ V approximately and $V_{low}=-4.5$ V approximately, although the output levels can be shifted by means of shift diodes, depending on the chosen supply voltages.

However, the following are the framing values or limit values of ECL type silicon circuits:

| | |
|---|---|
| high output level: | $-1.03 < V_{oh} < -0.88$ |
| low output level: | $-1.83 < V_{ol} < -1.62$ |
| high input level: | $-1.1 < V_{ih}$ |
| low input level: | $V_{il} < -1.5$ | and the limits values of CMOS type silicon circuits are:

| | |
|---|---|
| high output level: | $-4.9 < V_{oh}$ |
| low output level: | $< V_{ol} < -0.1$ |
| high input level: | $-3.5 < V_{ih}$ |
| low input level: | $V_{il} < -1.5$ |

SUMMARY OF THE INVENTION

The input interface according the invention enables this problem of differences between the output voltages of the silicon circuits and the voltages required at input of a GaAs circuit to be resolved. It comprises a first stage in which the input signal is shifted and then compared to a reference voltage, through an amplifier that forms a second stage. A second amplifier, at the third stage, regenerates the signals and increases the gain. The output signal S is compatible with a GaAs circuit, either directly or through a BFL circuit, mounted on the fourth stage, which gives the complementary signal $\overline{S}$.

More precisely, the invention concerns an interface circuit between two digital circuits having different natures, designed to adapt the output voltages of a first circuit to the input limit values of a second circuit, said interface circuit comprising:

- a first shifter stage, formed by two parallel-mounted shifters, of which the first shifter receives the output voltage of the first digital circuit at its input and the second shifter shifts a reference voltage;
- a second comparator stage formed by a first BFL type inverter, the input transistor of which receives the signal coming from the first shifter at its gate and the signal coming from the second shifter at its source;
- a third amplifier stage formed by a second BFL type inverter, which delivers, at its output, a signal in accordance with the input limit value of the second digital circuit.

BRIEF DESCRIPTION OF THE DRAWINGS

The invention will be understood more clearly from the following description of two examples of application, based on the following figures, of which:

FIG. 1 shows an electrical diagram of an input interface circuit according to the invention, between ECL and BCF;

FIG. 2 shows an electrical diagram of the circuit for preparing the reference voltage for the circuit of the preceding figure according to one embodiment of the present invention;

FIG. 3 shows an electrical drawing of an input interface circuit according to the invention, between CMOS and BFL.

DETAILED DESCRIPTION OF THE INVENTION

FIG. 1 shows the diagram of an interface made on GaAs, between the output of an ECL circuit (not shown) on silicon and the input of a circuit on GaAs (not shown).

In order that the GaAs integrated circuit, provided with one or more interfaces according to the invention, may be interchangeable with an ECL circuit on silicon, and in order to preserve the margins of noise, the same limit values as those of an ECL circuit are put on the input interface. These are:

$$V_{high} = -1.1 \text{ V}$$

$$V_{low} = -1.5 \text{ V}.$$

or again an excursion of 400 mV centered around $-1.3$ V, which shall be called a switch-over voltage.

This set of limit values enables the direct matching at output of an ECL circuit. If this ECL circuit has an output voltage $V_{oh}$ of between $-0.88$ and $-1.03$ V, this voltage is higher than $-1.1$ V: the interface identifies a voltage $V_{oh}$. If, on the contrary, the ECL circuit has an output voltage $V_{oL}$ of between $-1.62$ and $-1.83$ V, this voltage is lower than $-1.5$ V: the interface identifies a voltage $V_{oL}$.

It is very difficult to keep to these limit values with a direct structure, owing to variations due to the technology (the threshold voltage $V_t$ of a field-effect transistor on GaAs is defined as more or less 200 mV, namely in a range of 400 mV, equal to the range $V_{high}-V_{low}$), drifts due to variations in temperature and variations in supply voltage. A comparator type structure is therefore used.

This comparator (stage A and partially B of FIG. 1) has two strictly identical shifters: the first one of these receives a signal ECL of between −1.1 and −1.5 V at its input E, and the second receives a reference voltage at its input Ref This reference voltage is equal to the switch-over voltage corrected by an offset voltage.

Each shifter has, after its input, a shielding circuit against overvoltages, made up of a resistor 1, with a value in the range of 300 ohms for the voltage levels cited, a diode 2, the anode of which is connected to $V_{ss}$=−5.5 V or $V_{rr}$=−3 V, and a second resistor 3, with a value in the range of 600 ohms. The resistors 1 and 3 are either standard elements or they are made, in a well known way, in the form of transistors without gates or in the form of transistors having their gates connected to the source.

A shifter properly speaking, supplied between $V_{dd}$=0 V and $V_{ss}$=−5.5 V, has an input transistor 4, a plurality of shift diodes 5 and a current source transistor 6. The ECL input signal is applied to the gate of the transistor 4 of the first shifter, and the external reference signal is applied to the gate of the transistor 4 of the second shifter.

Since these two shifters are identical, they change in parallel if the temperature changes. The input and reference voltages are affected in the same way by stray effects which do not modify the output signal.

The number of shift diodes 5 depends on the supply voltages chosen: for those cited, two diodes are appropriate. They bring about a voltage shift of the order of −2 V.

The output 7 of the shifter on the signal and the output 8 of the shifter on the reference, both of which are taken at the drains of the current source transistors 6, are applied respectively to the gate and source of the input transistor 9 of the second stage B.

This stage B is essentially a BFL type circuit, comprising an input transistor 9 supplied by a transistor 10 mounted as a current source, and followed by a follower transistor 11, a plurality of shift diodes 12 and a transistor 13 mounted as a current source. This diagram is well known. It is supplied between $V_{dd}$ and $V_{ss}$.

The comparison between the input signal E (stage A) and the reference signal i done by this inverter of the stage B, the change-over point of which is controlled by the shifted reference voltage. For, the transistor 9 may be considered a having its source connected to a reference voltage which is not fixed but variable, for example variable with the temperature.

To command the third stage C, there must be a voltage excursion of the order of −2 V on the drain of the input transistor 9 of the second stage. This is why two shifters are needed at the first stage, for the input signal and for the reference. If $V_{dd}$=0 V and $V_{ss}$=−5.5 V, as above, there is a −2 V shift after the diodes 5, about −3 V on the source of the transistor 9, and 0 to −2 V on the drain of this same transistor.

The stage B also forms an amplifier which has a gain of 4 to 5.

The third stage C and the fourth stage D of the interface according to the invention are also BFL circuits, like the second stage B, with the sole difference that the sources of the input transistors 19 and 29 are connected to a fixed pull down voltage with a fixed ratio $V_{rr}$−3 V, while that of the input transistor 9 is connected to a voltage subject to variation.

The third stage C is a regeneration (for digital signals) and amplification circuit: it provides an additional gain of the order of 5. At its output 24, it gives a signal S, having a level compatible with the one required at the input of a circuit on GaAs: −2.5 to −4.5 V.

The fourth stage D is an optional stage. It is exactly identical to the third stage C and makes it possible, if necessary, to obtain the output, at 34, of the signal $\overline{S}$ which is complementary to the signal S given at 34.

It has been stated that the voltage applied to the reference input is equal to the sum of the switch-over voltage of the ECL circuit (−1.3 V) and the offset voltage of the GaAs interface (200 mV). This offset or difference in voltage between the two inputs may vary from one circuit to another, and it is worthwhile to generate the reference voltage internally, using the switch-over voltage of the ECL circuit.

This is obtained using an interface circuit which is dedicated to the preparation of the reference voltage.

It can be seen that this interface circuit, shown in FIG. 2, is highly comparable to the interface of FIG. 1, and comprises:

a first stage A1, formed by two identical phase-shifters;

a second stage B1, formed by a BFL inverter;

a third stage C1, formed by another BFL inverter.

There are only two differences in the diagram:

a capacitor 16 is introduced between gate and drain of the input transistor 9 of the second stage B1, in order to ensure high stability, the output, taken at 25 before the inverter transistor 21 of the third stage C1, is looped to the input 15 of the second shifter of the first stage A1.

The switch-over voltage of the ECL circuit, which constitutes a "theoretical" reference voltage (−1.3 V), is applied to the input 14 of the first shifter of the interface. In working at the same supply voltages, and with the same transistors as the circuit of FIG. 1, the circuit of FIG. 2 generates an offset voltage between the inputs 14 and 15. In looping the output at 25 to the input 15 of the second shifter, the switch-over voltage and the offset voltage are added up, so that the real reference voltage is the one delivered by the output at 25.

This reference voltage is the one used between the reference inputs of a plurality of interfaces 26, 27, each one of which is in accordance with FIG. 1.

Again, one interface of a series of interfaces integrated on the chip of a GaAs circuit may be considered to be modified to give the other ones their reference voltage, which is insensitive to variations in technology, temperature and supply voltages.

The interface shown in FIGS. 1 and 2 concerns a matching circuit for matching an ECL circuit and a GaAs circuit, at input. The interface of FIG. 3 is an interface between a CMOS circuit and a GaAs circuit, at input.

The same general structure is adopted, but it is simplified because the CMOS circuits have an amplitude of more than 2 V at output (+1.5 V, +3.5 V), and it is therefore no longer necessary to use an external reference voltage to obtain an excursion of 2 V on the drain of the comparator transistor 9.

Like the previous interface this CMOS/BFL interface has a shifter stage A2, followed by a comparator stage B2, a regeneration and amplifier stage C2 and, possibly, a stage D2 which gives the two complementary outputs S and S̄.

The stages B2, C2, D2 are strictly identical to the stages B, C, D of the ECL/BFL interface of FIG. 1. Only the stage A2 of shifters is modified.

The input signal, which is between +1.5 and +3.5 V, is addressed to the input E of the first shifter. After the protection circuit 1+2+3 (which is the same as in FIG. 5), the mean input voltage is brought to 2.5 to 1.5 V. A plurality of diodes 5, supplied with a current source 6 connected to $V_{ss}=-5.5$ V, shifts the input signal by upto about $-3$ V. For the values indicated, six shift diodes 5 are needed.

It can be seen that this shifter is very close to the shifter of FIG. 1: the supply $V_{dd}$ and the transistor 4 are replaced therein by four diodes, because the CMOS signals have a magnitude that enables it.

At output 7 of this first shifter, a diode 28 is mounted in the ON direction towards a call-back voltage (namely a voltage that accelerates the change-over) $V_{ss}=-3$ V. It prevents the diode formed by the gate-source junction of the comparator transistor 9 from becoming conductive if the magnitude of the signals is too great.

The second shifter does not receive any external reference voltage at its input. It generates an internal reference, from the supply voltage $V_{dd}=0$ V which is shifted through four diodes 5.

The output voltage of this second shifter, at 8, is of the order of $-3$ V.

The two output voltages of the first and second shifters are addressed, respectively, to the gate and to the source of the input transistor 9 of the second stage B2, the drain of which experiences a voltage excursion of 2 V. The use of similar diodes in the two shifters enables the effects of temperature to be reduced to the minimum.

At a more general level, the adoption of similar structures (based on BFL circuits) for the ECL and CMOS input interfaces is useful in the case of application to pre-implanted networks, where the same elements are used.

As specified already, these interfaces are made directly on the chip of a GaAs integrated circuit, and connected to its inputs: the GaAs circuit then becomes interchangeable with an ECL or CMOS silicon circuit, since it has the same input limit values, but it works faster.

The input interface according to the invention is specified by the following claims.

What is claimed is:

1. An interface circuit between first and second digital circuits for adapting output voltages of the first digital circuit to input limit values of the second digital circuit, said interface circuit comprising:
    a first shifter stage (A), formed by two parallel-mounted shifters, a first shifter of which receives the output voltage of the first digital circuit at an input thereof (E) and a second shifter of which shifts a reference voltage;
    a second comparator stage (B) formed by a first BFL type inverter, an input transistor of which receives an output signal coming from the first shifter at a gate thereof and a signal coming from the second shifter at a source thereof;
    a third amplifier stage (C) formed by a second BFL type inverter, which delivers, at an output thereof, a signal (S) in accordance with the input limit value of the second digital circuit.

2. An interface circuit according to claim 1, further comprising, at least at the input of the first shifter, a shielding circuit for shielding against overvoltages of the output voltage of the first digital circuit, said shielding circuit being formed by a first resistor, a diode, an anode of which is connected to a supply voltage ($V_{ss}$ or $V_{rr}$) and a second resistor connected to the input of the first shifter.

3. An interface circuit according to claim 1, further comprising a fourth stage (D), formed by a third BFL type inverter which delivers, at an output thereof, a signal that is complementary to the signal delivered by the third stage (C).

4. An interface circuit according to claim 1, wherein the first digital circuit is made on silicon and the second digital circuit is made on GaAs or fast materials of the III-V group.

5. An interface circuit according to claim 4 wherein, if the first digital circuit is of ECL type, the reference voltage applied to an input of the second shifter is an external reference, each of the two parallel-mounted shifters, which are identical, being formed by a first transistor, a gate of which receives the output voltage of the first digital circuit (E) or reference voltage (Ref), a drain of which is connected to a first supply voltage ($V_{dd}$) and a source of which is connected to at least two shift diodes supplied by a second transistor mounted as a current source using a second supply voltage ($V_{ss}$).

6. An interface circuit according to claim 5, wherein the external reference voltage is prepared by a second circuit, an input of a first shifter of which receives a mean switch-over voltage of the output voltages of the ECL type first digital circuit, and an input of a second shifter of which receives output voltage taken at a drain of an input transistor of the BFL circuit of the third amplifier stage, said output voltage forming the reference voltage of the interface circuit.

7. An interface circuit according to claim 4, wherein, if the first digital circuit is of CMOS type, the reference voltage is an internal reference, prepared by the second shifter from a first supply voltage ($V_{dd}$), each of the two shifters being formed by a plurality of shift diodes in series, supplied by a transistor mounted as a current source from a second supply voltage ($V_{ss}$), an input signal (E) being applied to a first diode of the first shifter.

8. An interface circuit according to claim 7, wherein a diode is mounted between an output of the first shifter and an intermediate voltage ($V_{rr}$).

9. An interface circuit according to any one of claims 1 to 8, wherein the interface circuit is integrated into a chip of the second digital circuit, and forms an adaptation in the form of input contacts.

* * * * *

UNITED STATES PATENT AND TRADEMARK OFFICE
CERTIFICATE OF CORRECTION

PATENT NO. : 5,045,727

DATED : September 3, 1991

INVENTOR(S) : Jean-Yves Danckaert

It is certified that error appears in the above-identified patent and that said Letters Patent is hereby corrected as shown below:

On the Title page, item [75] Inventors:
The residence of the first inventor is incorrect, should be, --Les Ulis--.

Signed and Sealed this

Sixth Day of April, 1993

Attest:

STEPHEN G. KUNIN

*Attesting Officer*     Acting Commissioner of Patents and Trademarks